United States Patent [19]

Dickopp et al.

[11] 4,035,739
[45] July 12, 1977

[54] SIGNAL DYNAMIC COMPRESSION AND EXPANSION CIRCUITS

[75] Inventors: Gerhard Dickopp; Ernst Schröder, both of Hannover, Germany

[73] Assignee: Licentia Patent-Verwaltungs-G.m.b.H., Frankfurt am Main, Germany

[21] Appl. No.: 696,422

[22] Filed: June 15, 1976

[30] Foreign Application Priority Data

June 28, 1975 Germany .......................... 2529012

[51] Int. Cl.² ......................................... H03G 7/00
[52] U.S. Cl. ................................ 330/129; 330/136; 333/14
[58] Field of Search ............... 330/29, 85, 127, 129, 330/136; 333/14

[56] References Cited
U.S. PATENT DOCUMENTS 3,720,880  3/1973  Le Seigneur ........................ 330/29

Primary Examiner—James B. Mullins
Attorney, Agent, or Firm—Spencer & Kaye

[57] ABSTRACT

In a circuit for the automatic dynamic compression or expansion of a signal between its input and its output, the circuit presenting a useful signal path connected between its input and its output and connecting a first variable gain member which is electronically controllable for varying the transmission factor between the circuit input and output, the circuit also presenting a branch path connected at one point to the useful signal path and containing a second variable gain member which is electronically controllable for varying the transmission factor exhibited by the branch path, and a control voltage generator for generating a control voltage applied to control the variable gain members for effecting a counterregulation of the transmission factor of the branch path, relative to the transmission factor variation imparted to the useful signal path, there is further provided a combining circuit which receives the output signal from the second variable gain member and a signal proportional to a signal at a point in the useful signal path and which applies to the control voltage generator a control signal dependent on the difference between the signals received by the combining circuit.

8 Claims, 5 Drawing Figures

COMPRESSION

EXPANSION

COMPRESSION

EXPANSION

COMPRESSION

EXPANSION

SIGNAL DYNAMIC COMPRESSION AND EXPANSION CIRCUITS

BACKGROUND OF THE INVENTION

The present invention relates to automatic dynamic signal compression and expansion systems, particularly for use in high fidelity sound reproduction equipment.

It is known that the quality of the reproduction of audio frequency performances can be improved by increasing the signal to noise ratio by means of a compression-expansion system known as a compander system, in which the useful signals are compressed in amplitude before they enter a transmission path susceptible to interference, e.g. a line or a recording tape, and are expanded after transmission.

Design of the known systems is based on the goal of meeting, inter alia, the following requirements to the maximum extent possible: low cost, corresponding characteristics during compression and expansion, good reproducibility of the required values in instruments of, for example, a mass-fabricated series, and the expandability of the system concept with respect to the selection of the degree of expansion and compression. The known compression-expansion systems are either relatively expensive and produce good quality or they are less expensive, as required for instruments sold to the general public, and do not meet the above requirements to a satisfactory degree.

German Auslegeschrift [Published Patent Application] No. 24, 06, 258 and corresponding U.S. application Ser. No. 543,931, filed on Jan. 24th, 1975, and now U.S. Pat. No. 3,969,680, disclose a circuit for automatic dynamic compression or expansion in a useful signal path which includes means for varying the transmission factor. In this circuit, a path branches off from the output or input, respectively, of the useful signal path, a control voltage is derived from the useful signal path in a signal-responsive control voltage generator disposed in the branch path, and this control voltage is fed to the means for varying the transmission factor in the useful signal path. The control voltage is also fed to means for varying the transmission factor in the branch path in a manner to effect a counterregulation of the transmission factor in the branch path.

This counterregulation causes the control characteristics for compression and expansion, which will be referred to hereinafter simply as characteristics, and which are represented by the dependence of the output signals $U_2$ upon the input signals $U_1$ as shown in FIG. 1, to become approximately linear on a logarithmic scale of the signal voltages, so that their reproducibility in the instruments of a mass-produced series becomes easier. Normal fluctuations in the properties of the individual components have no significant influence.

The characteristics attainable with the described circuit exhibit, as shown in FIG. 1, a first, linear part 1 with a slope corresponding to the constant gain of the system at low input levels and a second, likewise linear portion 2 with a slope which is less than that in the first portion 1 and which corresponds to a dynamic compression. When a certain control value has been reached, for example if the so-called rated or reference level has been reached in recording studio systems, the characteristic changes to a third linear portion 3 which again corresponds to the predetermined constant gain.

SUMMARY OF THE INVENTION

It is an object of the invention to improve the noise suppression in such a system.

A more specific object of the invention is to improve the shape of the output/input signal characteristic between the dynamic compression region and the region above the reference level, i.e. in the transition between curve portions 2 and 3 of FIG. 1. It has been found that the exact bend 4, e.g. at the rated level, can be reproduced easily and with sufficient quality even in different fabrication series, but that, beginning abruptly with the point of the bend no dynamic compression or expansion takes place at all above this point 4. This may have the result, for example, that even with the use of frequency-dependent feedback the means for varying the transmission factor disposed in the useful signal path and in the branch path may have their input signals modulated with uncovered noise at the frequencies of low-frequency useful sounds.

This effect could be suppressed if the characteristic in this above-mentioned region would have a form which corresponds to a constant value of the differential quotient of the output and input, i.e. a curved shape. Since, however, it is the general intent to achieve a reproducible characteristic and since the above-mentioned bend in the characteristic is provided in particular to avoid an arbitrary and uncontrollable curvature in the characteristic, it is the particular object of the invention to replace the above-mentioned bend in the characteristic by a curved portion having a constant, easily reproducible path.

The objects according to the invention are achieved by additionally providing a circuit of the type described above with a combining circuit which receives the output signal from the means for varying the transmission factor in the branch path and a signal proportional to a signal at a point in the useful signal path and which applies to the input of the control voltage generator a control signal whose value depends on the difference between the signals received by the combining circuit.

The invention offers the advantage that compression or expansion, respectively, of signal components at higher frequencies is maintained for useful signals at relatively low frequencies even if the signal level corresponds to a value somewhat above the point of the bend 4. This assures noise compression also in such cases.

DESCRIPTION OF THE PREFERRED EMBODIMENTS

Figure 2:
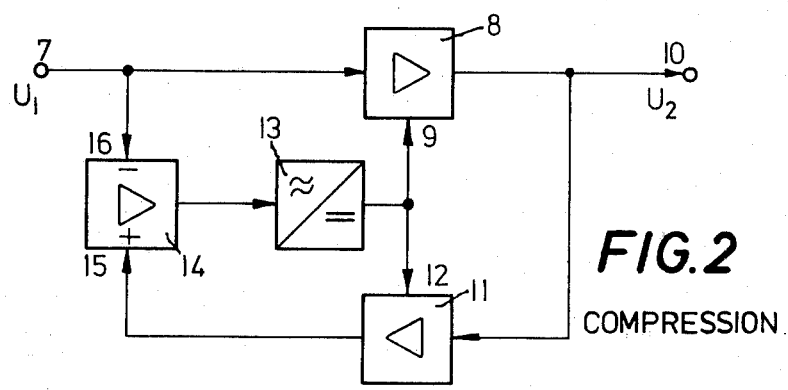
FIGS. 2 and 5 are block circuit diagrams for four embodiments of circuits according to the present invention.

Referring first to FIG. 2, there is shown a circuit according to the invention for the compression of alternating voltage signals, which circuit may be used, for example, for recording in a tape recorder.

This circuit acts to convert input signals $U_1$ present at input terminal 7 and having a certain dynamic range into output signals $U_2$ available at output terminal 10 and having a narrower dynamic range. For this purpose, a variable gain amplifier 8 is disposed in the useful signal path between terminals 7 and 10. Amplifier 8 has a control input 9 via which its gain can be controlled by means of a direct control voltage in order to vary the transmission factor, i.e. gain or attenuation level, between the input and output terminals.

A branch path including a further variable gain amplifier 11 whose input is connected to the output of amplifier 8 is provided for the generation of the direct control voltage. The output of amplifier 11 feeds, via a combining circuit 14, a control voltage generator 13 which produces at its output a direct voltage whose amplitude is dependent on the amplitude of the alternating voltage applied to its input. This direct voltage is fed as the control voltage to the control inputs 9 and 12 of amplifiers 8 and 11. The gain of amplifier 11 can be influenced by the voltage at its control input 12 as can the gain of amplifier 8 by the voltage at its control input 9.

The described circuit narrows the dynamic range of the useful signal since with increasing output voltage of amplifier 8 a direct control voltage appears at the output of control voltage generator 13 which acts to reduce the gain of amplifier 8. In addition, the gain of amplifier 11 is then also reduced so that a counterregulation takes place in the branch path which almost linearizes the logarithmic representation of the control characteristic of the compression circuit. Thus, the control voltage at the output of generator 13 in the circuit of FIG. 2 is a regulating voltage. This effect will be explained in connection with FIG. 1 where the combining circuit 14 will initially be disregarded.

Figure 1:
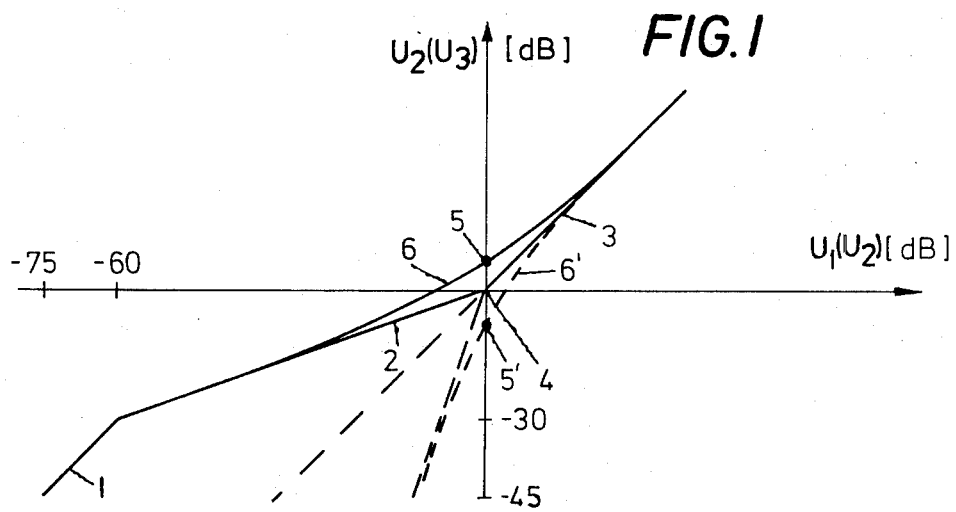
FIG. 1 is a characteristic diagram illustrating the operation of circuits according to the invention.

FIG. 1 is the usual representation of a voltage level diagram. Since above the rated level of 0 dB, at the origin of the abscissa, no signal amplitude compression takes place, only the useful signals $U_1$ between −75 dB, the assumed threshold of the noise from the source, and the rated level which lies at 0 db, for example, will be considered. The absolute value of the input voltage increases on the abscissa from the left toward the right until it reaches the rated level. The output levels $U_2$, with compression in the illustrated case, lie between −45 dB and 0 dB. The absolute value of the output voltage rises on the ordinate from the bottom toward the top until it reaches the rated level. With exact subsequent expansion the output signals will again lie between the stated values of −75 dB and 0 dB.

The curve 1, 2, 3 of the dependence of the output level $U_2$ on $U_1$ constitutes the characteristic of the compression circuit of FIG. 2, as thus far described. Between −75 dB and −60 dB for input signal $U_1$, there is a constant gain of 30 dB, corresponding to a slope of 45° for characteristic portion 1, so that with an assumed identical maximum gain for amplifiers 8 and 11 in the circuit of FIG. 2, there will be a gain of 60 dB at the output of amplifier 11 relative to the input voltage $U_1$ at input terminal 7. Only when the input level $U_1$ reaches −60 dB, at the point of the bend in the characteristic between portions 1 and 2, which due to the gain of 60 dB corresponds to a level of 0 dB at the output of amplifier 11, will the regulating effect, i.e. the compression set in the illustrated example because then the response threshold of the control voltage generator 13 is exceeded. Beginning with the value $U_1 = -60$ dB, the gain of amplifier 8 continuously decreases and at an input level of 0 dB it has the value 0 dB, i.e. a gain of 1. Beyond the bend 4 between curve portions 2 and 3, input signals at levels above 0 dB are amplified with a constant gain value of 1. It can be seen that the dynamic range from −75 dB to 0 dB of the input signals $U_1$ is reduced to a range of −45 dB to 0 dB of the output signals $U_2$. In the illustrated case subsequent expansion will occur in a manner corresponding to the compression.

To eliminate the bend 4 between characteristic curve portions 2 and 3 of FIG. 1, the circuit of FIG. 2 is provided, in addition to the described circuit members, with a combining circuit 14 which has two inputs 15 and 16 and an output which is connected with the input of the control voltage generator 13.

The combining circuit 14 is designed so that the signal appearing at its output has an amplitude equal to the difference between the amplitudes of its two input signals, the signal value at input 16 being subtracted from the signal value at input 15. In the illustrated circuit, input 16 of the combining circuit 14 receives the entire input voltage $U_1$ of the useful signal path leading from the input terminal 7 via amplifier 8 to the output terminal 10. It is also possible, however, to connect an attenuation member or an amplifying member, for example, between the useful signal path and input 16 of the combining circuit 14 so as to process only an attenuated or even an amplified portion of the useful signals in the combining circuit 14.

The described provision of the combining circuit 14 has the effect that for the illustrated circuit a characteristic will result which corresponds to characteristic 6 in FIG. 1. Instead of the sharp bend 4, characteristic 6 has a certain value, e.g. 3 dB, at point 5 when the input level for $U_1$ is 0 dB. Below and above point 5 the characteristic asymptotically approaches characteristic portions 2 and 3, respectively.

The curves of FIG. 1 depict only the basic mode of operation of the combining circuit 14 but it can be seen that characteristic 6 has a form such that the differential quotient of the characteristic 6 is continuous in the region of the rated level around 0 dB.

Since the point of intersection 5 of characteristic 6 with the ordinate of FIG. 1 can be accurately reproduced without matching even in circuits from different manufacturing series, the characteristic 6 of the described circuit meets the above-stated reproducibility requirements.

Figure 3:
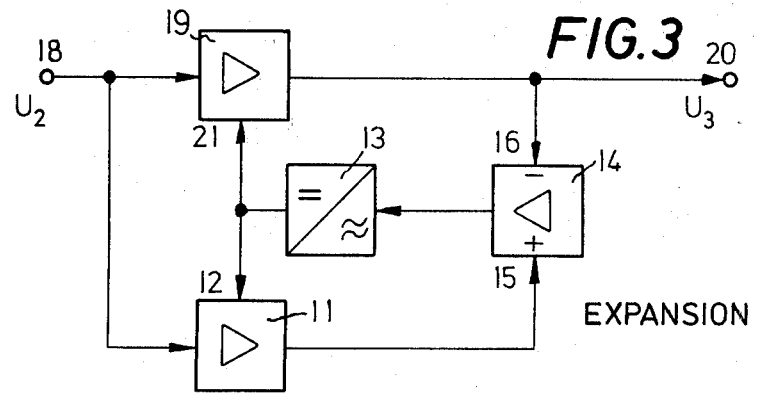

FIG. 3 shows a circuit according to the invention for the corresponding expansion of previously compressed alternating voltage signals. Such a circuit is used, for example, to expand the signals which have been compressed from $U_1$ to $U_2$ by means of the circuit shown in FIG. 2 so that the output signals $U_3$ will again have the dynamic range of the input signals $U_1$ of the circuit of FIG. 2. The circuit of FIG. 3 would thus be employed during playback of signals which had been recorded after compression in the circuit of FIG. 2.

The expansion circuit shown in FIG. 3 includes a variable gain amplifier 19 between input terminal 18 and output terminal 20. The branch path, whose input in this case is connected to the input instead of the output of amplifier 19 in the useful signal path, includes the variable gain amplifier 11 described in connection with FIG. 2. The control input 21 of amplifier 19 as well as the control input 12 of amplifier 11 are fed by the output of control voltage generator 13. Amplifier 19 is designed, due to the required expansion, so that the slope of its amplifying characteristic has the opposite sign from that of the control characteristic of amplifier 8 of FIG. 2, while amplifier 11 of FIG. 3 is identical to amplifier 11 of FIG. 2 and is counterregulated in the same manner. If the input voltage $U_2$ increases and thus the amount of direct control voltage at the control inputs 21 and 12 increases, this has the result that the gain of amplifier 19 is increased while the gain of amplifier 11 is reduced.

This relation can also be effected by disposing a phase reversal circuit for the direct control voltage between control voltage generator 13 and one of the two, in this case, otherwise identically constructed amplifers 11 and 19. Identically constructed amplifiers can also be used if the gain of each is determined by a feedback connected voltage divider. The same control voltage for both amplifiers then controls in a known manner, as disclosed in German Offenlegungsschrift [Laid-Open Application] No. 22, 18, 823, the one voltage divider resistance for compression and the other voltage divider resistance for expansion.

As in the circuit of FIG. 2, a combining circuit 14 is inserted in the circuit of FIG. 3 between the output of amplifier 11 and the input of control voltage generator 13. This combining circuit 14 corresponds to combining circuit 14 of FIG. 2 and is constructed in the same manner. Since, however, the circuit of FIG. 3 is an expansion circuit, the input 16 of combining circuit 14 is connected to the output of amplifier 19 rather than to its input.

The effect of the addition of the combining circuit 14 in the expansion circuit of FIG. 3 is correspondingly compelementary to the effect of the combining circuit of FIG. 2. There thus results the characteristic 6' for the expansion circuit which is shown in broken lines in FIG. 1, with a point 5' corresponding to point 5 as the point of intersection with the ordinate for an input level $U_2$ of 0 dB.

Figure 4:
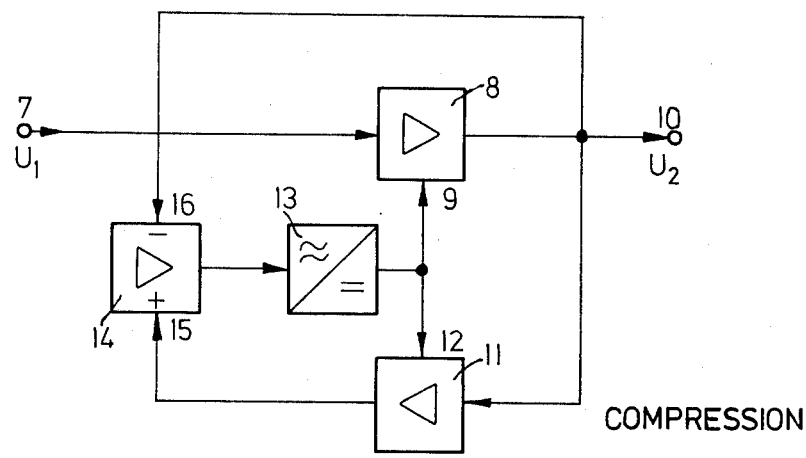

FIG. 4 shows an embodiment of a compression circuit which differs from the compression circuit of FIG. 2 only in that input 16 of combining circuit 14 is connected to the output of amplifier 8 instead of to its input. This circuit operates similarly to the circuit of FIG. 2. The characteristic portion around 0 dB is a curve which is also asymptotic to characteristic portions 2 and 3. The value for the point of intersection with the ordinate, at input level 0 dB, is merely somewhat greater. In this circuit it is also possible to include, for example, an attenuation member or an amplifying member between the useful signal path and input 16.

Figure 5:
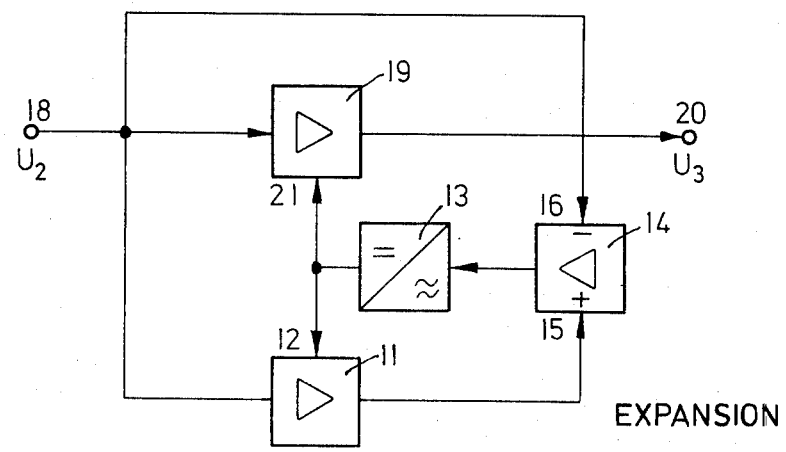

The circuit shown in FIG. 5 is provided for expansion of the output signals $U_2$ produced in the circuit of FIG. 4 and corresponds in its effect to the circuit of FIG. 3.

If, in the above-described circuits, not all of the voltage obtained from the useful signal path is fed to the input 16 of combining circuit 14, but only a small portion thereof, the characteristics will have a shape such that they are asymptotic or parallel to characteristic portion 2, respectively, in their lower portions. However, above the rated level of 0 dB they will connect with characteristic portion 3 in a manner to form a bend. These characteristics are not quite as advantageous with respect to the curve path of characteristic portions 2 and 3 as is the actually constant path corresponding to curve 6, but they still constitute an improvement compared to the characteristic with bend 4. For the case where a voltage which is amplified with respect to the useful signal is fed to the input 16 of combining circuit 14, curve paths result which do not hug the characteristic portions closely above the rated level.

It will be understood that the above description of the present invention is susceptible to various modifications, changes and adaptations, and the same are intended to be comprehended within the meaning and range of equivalents of the appended claims.

What is claimed is:

1. In a circuit for the automatic dynamic compression or expansion of a signal between its input and its output, the circuit presenting a useful signal path connected between its input and its output and containing a first variable gain member which is electronically controllable for varying the transmission factor between the circuit input and output, the circuit also presenting a branch path connected to the useful signal path and containing a second variable gain member which is electronically controllable for varying the transmission factor exhibited by said branch path, and a control voltage generator having an input and arranged to generate a control voltage proportional to the signal at its input, and means applying the control voltage to the first and second variable gain members, for regulating the transmission factor of the useful signal path and for effecting a counterregulation of the transmission factor of said branch path, relative to the transmission factor variation imparted to said useful signal path, the improvement comprising:

means defining a combining circuit having a first input connected to receive the output signal from said second variable gain member and a second input connected to receive a signal proportional to a signal at a point in said useful signal path, and having an output connected to said input of said control voltage generator for supplying thereto a signal which is a function of the difference between the signals at said first and second inputs of said combining circuit.

2. A circuit as defined in claim 1 wherein said combining circuit produces an output signal proportional to the difference between the signals at said first and second inputs of said combining circuit.

3. A circuit as defined in claim 1 constituting a compression circuit and wherein said second input of said combining circuit is connected to the input of said compression circuit.

4. A circuit as defined in claim 1 constituting an expansion circuit and wherein said second input of said combining circuit is connected to the output of said expansion circuit.

5. A circuit as defined in claim 1 constituting a compression circuit and wherein said second input of said combining circuit is connected to the output of said compression circuit.

6. A circuit as defined in claim 1 constituting an expansion circuit and wherein said second input of said combining circuit is connected to the input of said expansion circuit.

7. A circuit as defined in claim 1 constituting a compression circuit and wherein the transmission factor variation produced by said second variable gain member, in response to a control voltage variation, is substantially the same as that produced by said first variable gain member, and the signal applied to said second input of said combining circuit is equal to the signal at such point in the useful signal path.

8. A circuit as defined in claim 1 constituting an expansion circuit and wherein the transmission factor variation produced by said second variable gain member, in response to a control voltage variation, is complementary to that produced by said first variable gain member, and the signal applied to said second input of said combining circuit is equal to the signal at such point in the useful signal path.

* * * * *